(12) United States Patent
Seo et al.

(10) Patent No.: US 11,088,117 B2
(45) Date of Patent: Aug. 10, 2021

(54) SEMICONDUCTOR PACKAGE INCLUDING STACKED SEMICONDUCTOR CHIPS

(71) Applicant: SK hynix Inc., Icheon-si (KR)

(72) Inventors: Hyun-Chul Seo, Yongin-si (KR); Jun-Sik Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/709,786

(22) Filed: Dec. 10, 2019

(65) Prior Publication Data

US 2021/0013180 A1 Jan. 14, 2021

(30) Foreign Application Priority Data

Jul. 8, 2019 (KR) .......................... 10-2019-0081983

(51) Int. Cl.
| | |
|---|---|
| *H01L 25/065* | (2006.01) |
| *H01L 23/31* | (2006.01) |
| *H01L 23/00* | (2006.01) |
| *H01L 23/522* | (2006.01) |

(52) U.S. Cl.
CPC ...... *H01L 25/0657* (2013.01); *H01L 23/3121* (2013.01); *H01L 23/522* (2013.01); *H01L 24/05* (2013.01); *H01L 24/29* (2013.01); *H01L 2224/02371* (2013.01)

(58) Field of Classification Search
None
See application file for complete search history.

(56) References Cited

U.S. PATENT DOCUMENTS

| | | | | |
|---|---|---|---|---|
| 9,373,574 | B2* | 6/2016 | Jang | ........................ H01L 24/97 |
| 2010/0314740 | A1* | 12/2010 | Choi | ..................... H01L 25/105 |
| | | | | 257/686 |
| 2013/0130442 | A1* | 5/2013 | Nakashiba | ........ H01L 23/49534 |
| | | | | 438/109 |
| 2019/0295998 | A1* | 9/2019 | Im | ....................... H01L 29/0657 |
| 2021/0012180 | A1* | 1/2021 | Saadallah | ......... H04W 52/0245 |
| 2021/0035913 | A1* | 2/2021 | Park | .................... H01L 25/0652 |

FOREIGN PATENT DOCUMENTS

KR 101811738 B1 12/2017

* cited by examiner

*Primary Examiner* — Long Pham
(74) *Attorney, Agent, or Firm* — William Park & Associates Ltd.

(57) ABSTRACT

Disclosed is a semiconductor package. The semiconductor package includes a substrate including an opening, a first semiconductor chip, disposed on the substrate, including a plurality of first chip pads exposed through the opening, a second semiconductor chip, disposed on the first semiconductor chip to partially overlap with the first semiconductor chip, including a plurality of second chip pads, aligned with the opening, and a redistribution layer formed on a surface on which the second chip pads of the second semiconductor chip are disposed. One or more of the second chip pads overlaps with the first semiconductor chip and is covered by the first semiconductor chip and with the remaining pads of the second chip pads being exposed through the opening. The redistribution layer includes redistribution pads, exposed through the opening, and includes redistribution lines, configured to connect the one or more of the second chip pads to the redistribution pads.

21 Claims, 13 Drawing Sheets

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2019-0081983 filed on Jul. 8, 2019, which is incorporated herein by reference in its entirety.

BACKGROUND

1. Field

Exemplary embodiments relate to a semiconductor package, and more particularly, to a semiconductor package in which a plurality of chips are stacked on a substrate.

2. Discussion of the Related Art

Electronic products are gradually getting smaller and are required to process high capacity data. Therefore, it is necessary to increase the degree of integration of semiconductor devices used in such electronic products.

However, since it is difficult to satisfy a required capacity with only a single semiconductor chip, due to the limitation of a semiconductor integrated technology, a semiconductor package has been fabricated in which a plurality of semiconductor chips are embedded in one semiconductor package.

Even though the semiconductor package includes a plurality of semiconductor chips, it is necessary to satisfy demands for improving accuracy and speed of operations, minimizing size, simplifying processes, and reducing cost.

SUMMARY

In an embodiment, a semiconductor package may include a substrate including an opening; a first semiconductor chip, disposed on the substrate, including a plurality of first chip pads exposed through the opening; a second semiconductor chip, disposed on the first semiconductor chip to partially overlap with the first semiconductor chip, including a plurality of second chip pads, aligned with the opening; and a redistribution layer formed on a surface on which the second chip pads of the second semiconductor chip are disposed. One or more of the second chip pads may overlap with the first semiconductor chip and may be covered by the first semiconductor chip, with the remaining pads of the second chip pads being exposed through the opening. The redistribution layer may include redistribution pads exposed through the opening, and includes redistribution lines, configured to connect the one or more of the second chip pads to the redistribution pads.

DETAILED DESCRIPTION

Figure 1:
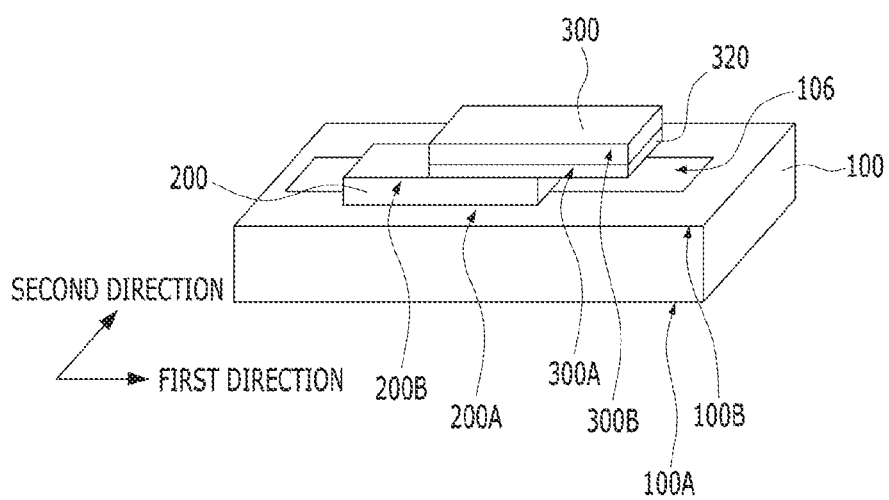
FIG. 1 is a perspective view schematically illustrating a semiconductor package in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Throughout the specification, when one element is referred to as being 'connected to' or 'coupled to' another element, it may indicate that the former element is directly connected or coupled to the latter element or electrically connected or coupled to the latter element with another element interposed therebetween. Furthermore, when an element "includes" or "comprises" a component, it means that the element does not exclude another component but may further include or comprise another component, unless referred to the contrary. Moreover, although components described in the specification are represented in the form of a singular form, the present embodiment is not limited thereto, but the corresponding components may also be represented in the form of a plural form.

Various embodiments are directed to provide a semiconductor package capable of improving processes and operation characteristics with a reduced size.

Figure 2:
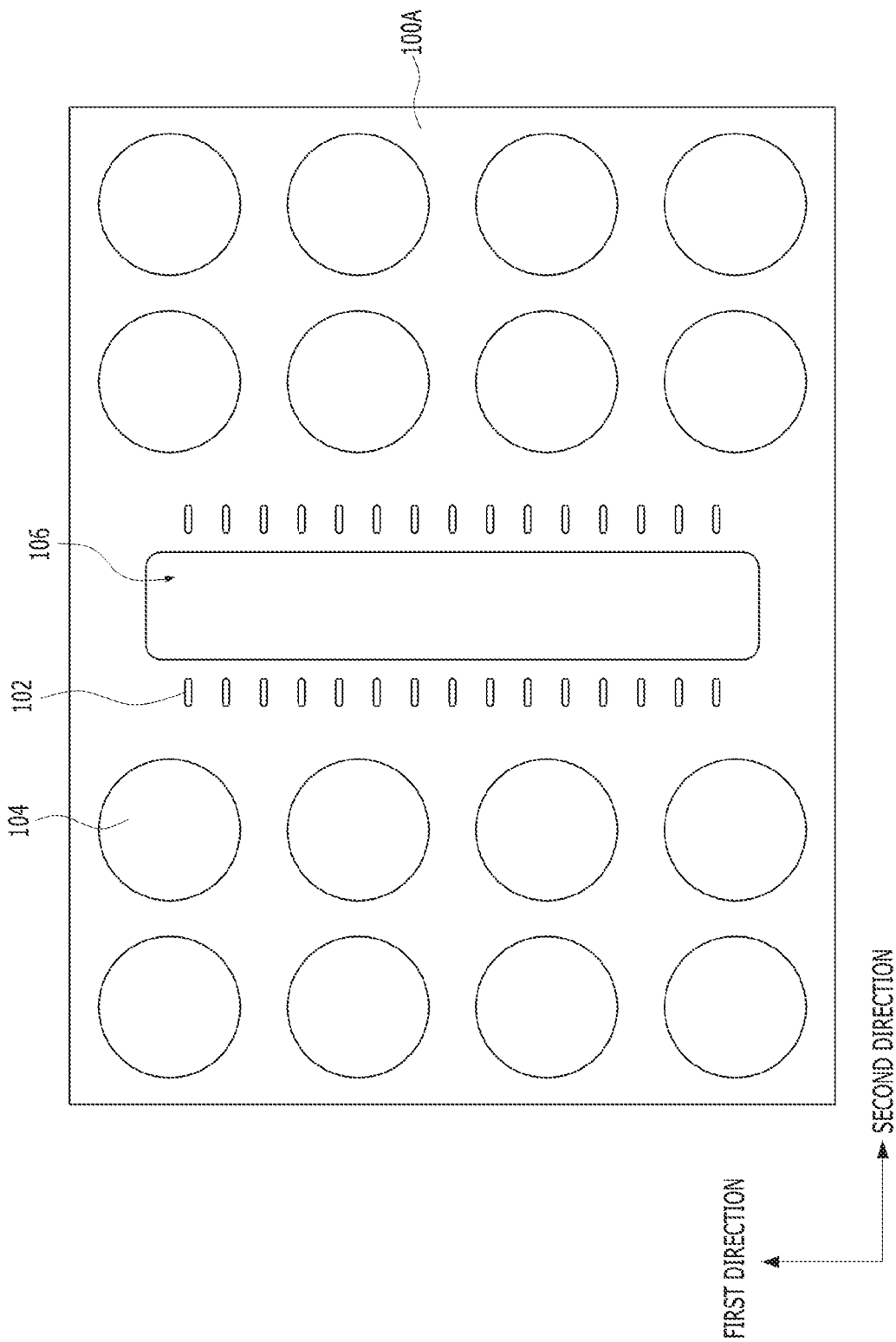
FIG. 2 is a plan view illustrating a bottom surface of a substrate of the semiconductor package of FIG. 1.
Figure 3:
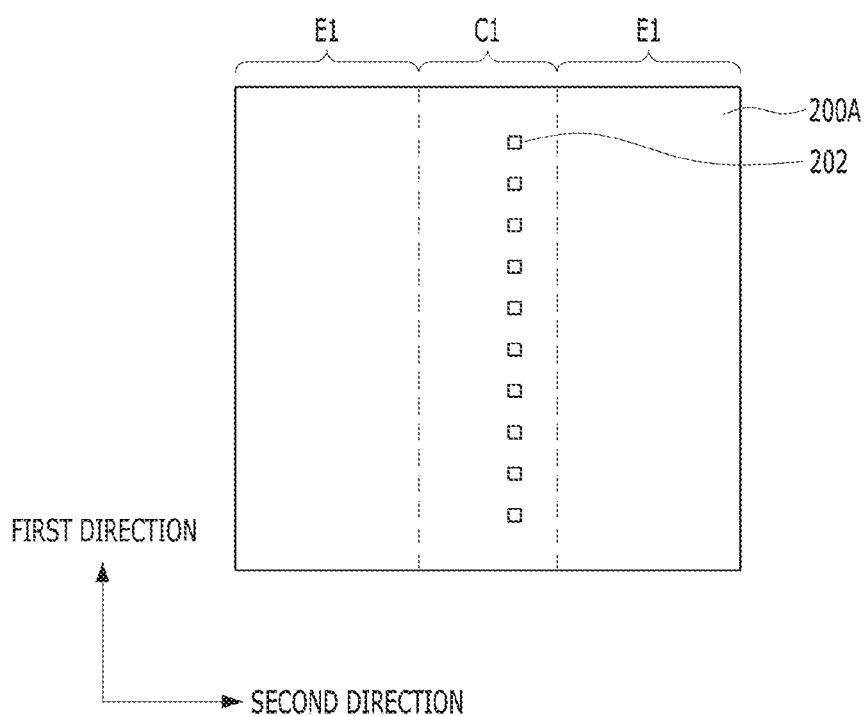
FIG. 3 is a plan view illustrating a bottom surface of a first semiconductor chip of the semiconductor package of FIG. 1.

FIG. 1 to FIG. 7 are views explaining a semiconductor package in accordance with an embodiment. Specifically, FIG. 1 is a perspective view schematically illustrating the semiconductor package in accordance with the embodiment. FIG. 2 is a plan view illustrating a bottom surface of a substrate of the semiconductor package of FIG. 1. FIG. 3 is a plan view illustrating a bottom surface of a first semiconductor chip of the semiconductor package of FIG. 1. FIG.

Figure 4A:
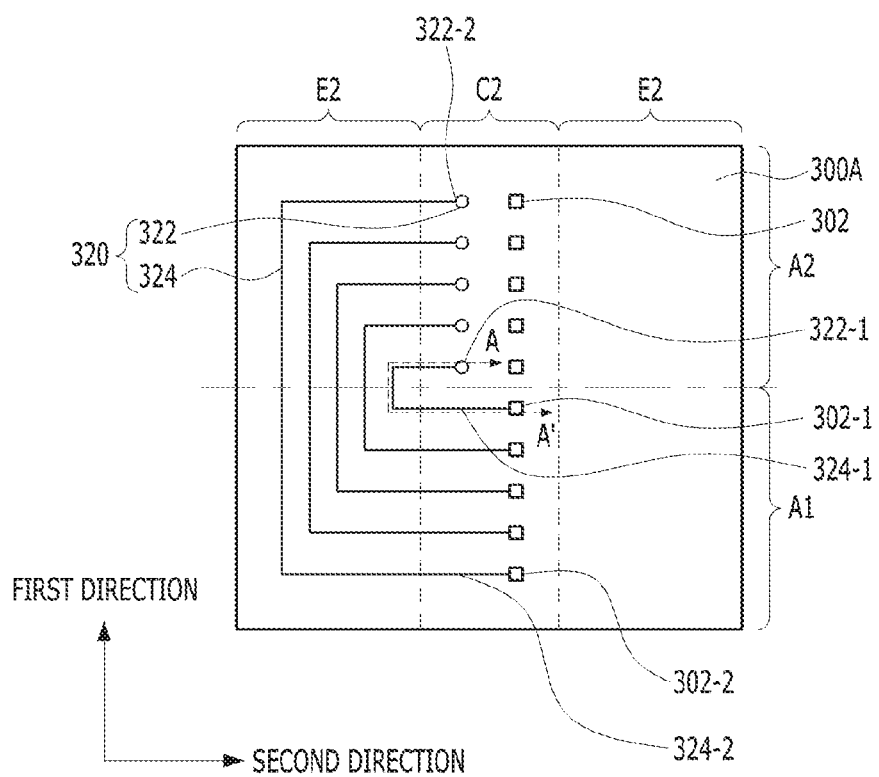
FIG. 4A is a plan view illustrating a bottom surface of a second semiconductor chip of the semiconductor package of FIG. 1.
Figure 4B:
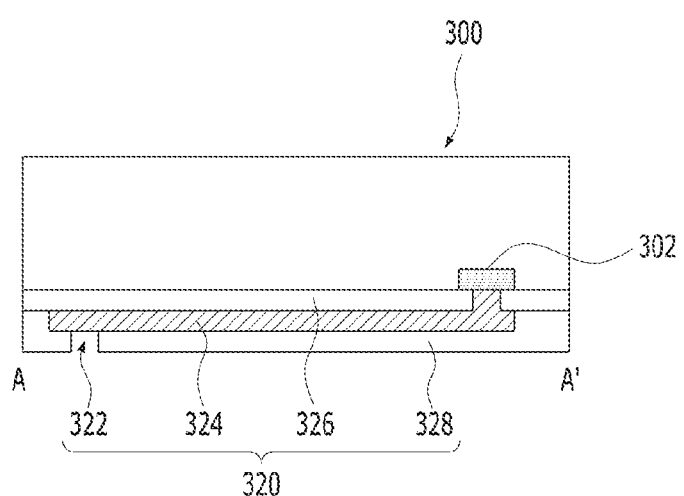
FIG. 4B is a sectional view taken along line A-A' of the plan view.
Figure 5:
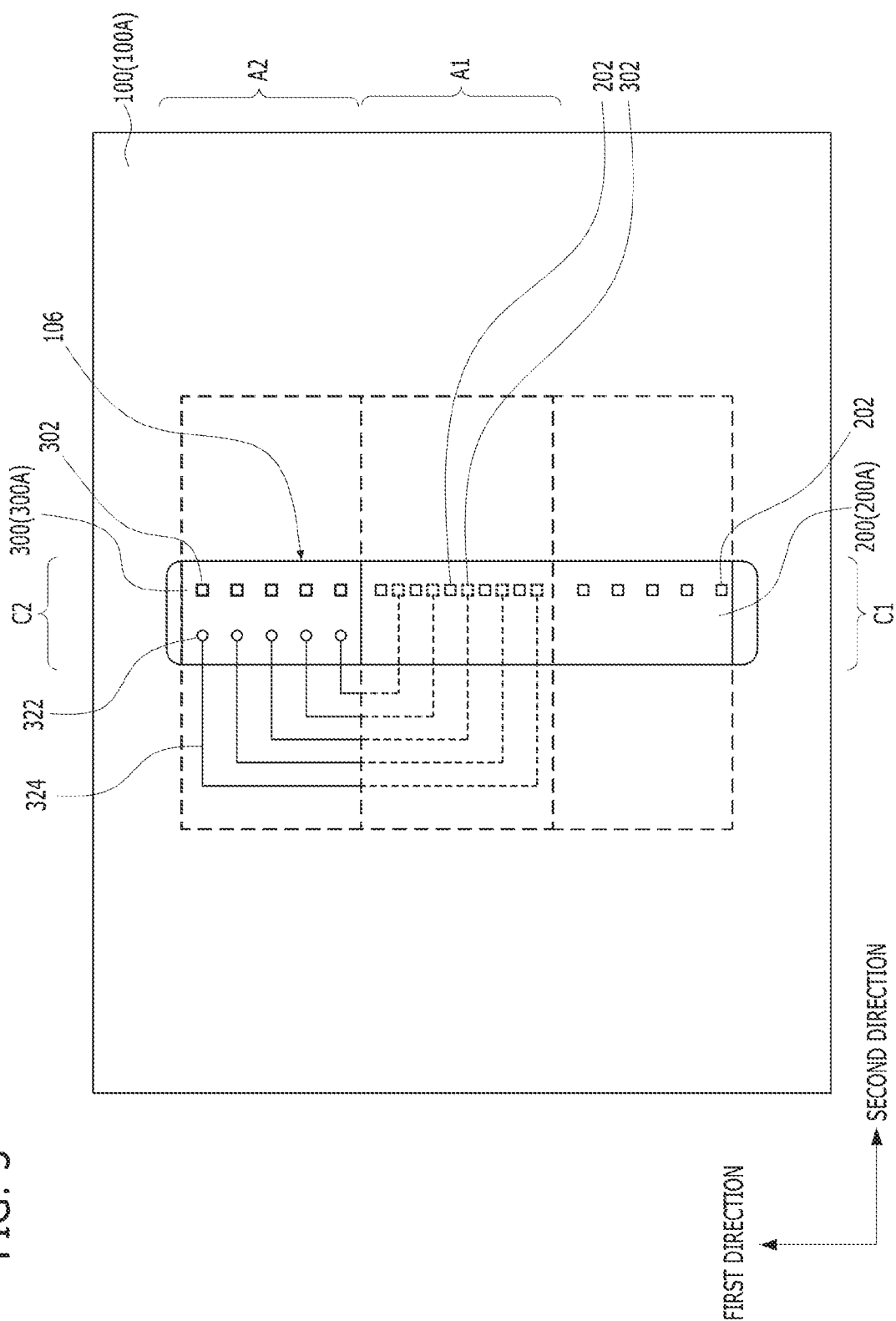
FIG. 5 is a plan view illustrating a bottom surface of the semiconductor package of FIG. 1 and is a view mainly illustrating the overlap between the first semiconductor chip and the second semiconductor chip and a redistribution layer, based on the overlapping.
Figure 6:
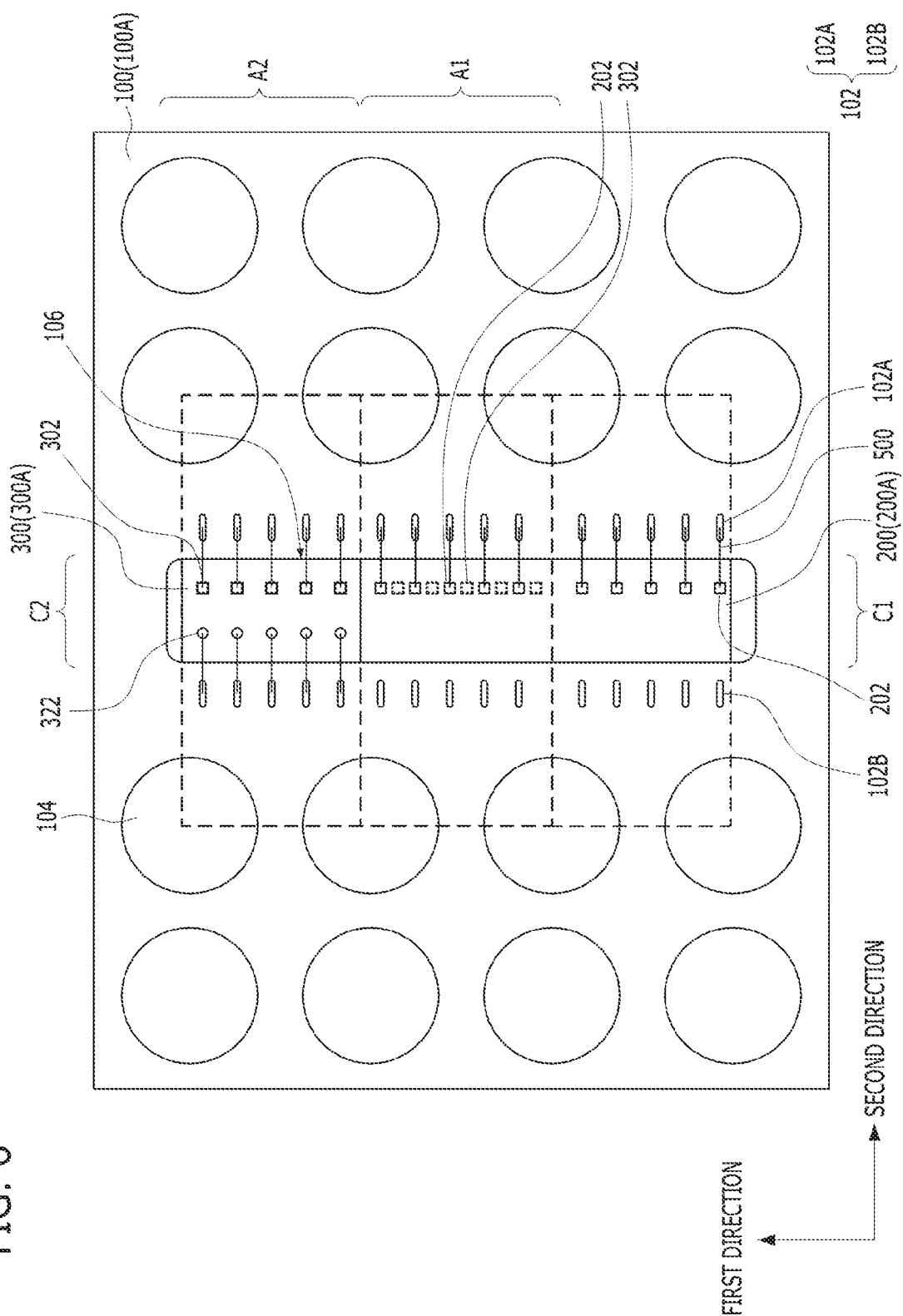
FIG. 6 is a plan view illustrating the bottom surface of the semiconductor package of FIG. 1 and is a view mainly illustrating the overlap between the first semiconductor chip and the second semiconductor chip, and connection with the substrate, based on the overlapping.
Figure 7:
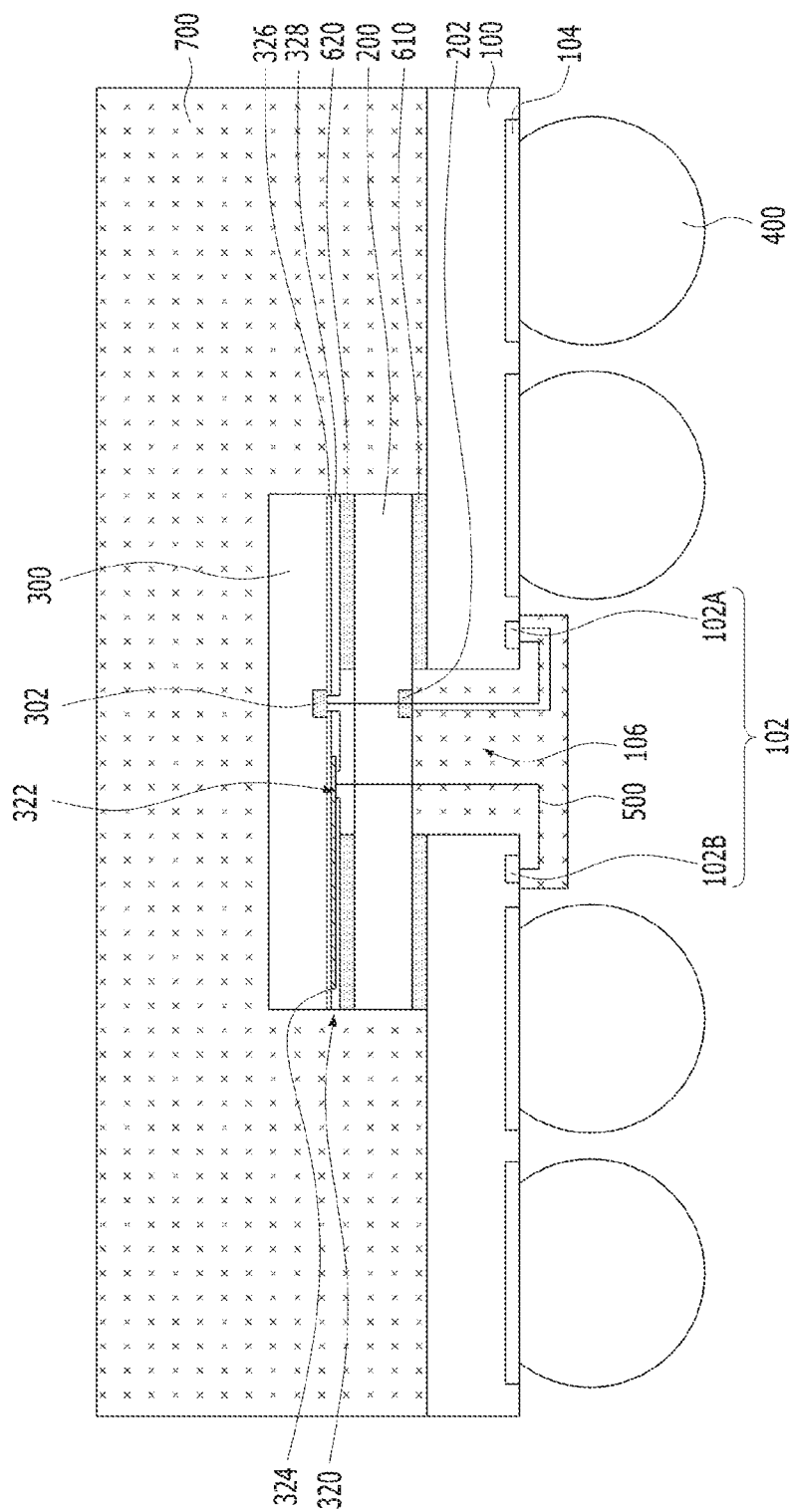
FIG. 7 is a side view of the semiconductor package of FIG. 1 in a second direction.

4A is a plan view illustrating a bottom surface of a second semiconductor chip of the semiconductor package of FIG. 1, and FIG. 4B is a sectional view taken along line A-A' of the plan view. FIG. 5 is a plan view illustrating a bottom surface of the semiconductor package of FIG. 1 and is a view mainly illustrating the overlap between the first semiconductor chip and the second semiconductor chip and a redistribution layer, based on the overlapping. FIG. 6 is a plan view illustrating the bottom surface of the semiconductor package of FIG. 1 and is a view mainly illustrating the overlap between the first semiconductor chip and the second semiconductor chip, and connection with the substrate, based on the overlapping. FIG. 7 is a side view of the semiconductor package of FIG. 1 in a second direction. The following description refers to at least one of FIG. 1 to FIG. 7 based on necessity.

Referring to FIG. 1, the semiconductor package of the present embodiment may include a substrate 100 and first and second semiconductor chips 200 and 300, stacked on the substrate 100 in a step-wise manner.

The substrate 100 may be a substrate for a semiconductor package having a circuit and/or an interconnection structure to transfer electrical signals such as a printed circuit board (PCB). The substrate 100 may have one surface (for example, a top surface 100B), on which various electronic elements, included in the semiconductor package, may be disposed. For example, the first and second semiconductor chips 200 and 300 may be disposed on the top surface 100B. On the other hand, another surface, the surface opposite to the top surface 100B (for example, a bottom surface 100A) may be connected to an element for connecting the semiconductor package to an external device. Furthermore, the substrate 100 may include an opening 106, penetrating both the top surface 100B and the bottom surface 100A. The opening 106 may have a bar-like shape extending in one direction. Hereinafter, the extension direction of the opening 106 is referred to as a first direction and a direction substantially perpendicular to the first direction is referred to as a second direction.

Referring to FIG. 1 and FIG. 2, first substrate pads 102 and second substrate pads 104 may be disposed on the bottom surface 100A of the substrate 100. The first substrate pads 102 may electrically connect the first and second semiconductor chips 200 and 300 on the top surface 100B of the substrate 100, to the substrate 100. The second substrate pads 104 may electrically connect external connection elements on the bottom surface 100A of the substrate 100, to the substrate 100. The substrate pads may indicate electrically conductive elements or terminals exposed through the surface of the substrate 100 in order to connect the substrate 100 to other components. The first and second substrate pads 102 and 104 may be a part of a circuit and/or an interconnection structure in the substrate 100.

The first substrate pads 102 may be disposed on both sides of the opening 106 in the second direction and may be arranged in a line in the first direction on each side of the opening 106. The first substrate pads 102 may be bond fingers for wire bonding. The second substrate pads 104 may be arranged in a region located farther than the first substrate pads 102 from the opening 106. The arrangement of the second substrate pads 104 is different from the arrangement of the first substrate pads 102. The second substrate pads 104 may be ball lands for bonding solder balls. The size and pitch of the first substrate pads 102 may be smaller than those of the second substrate pads 104. Furthermore, in the embodiment, the first substrate pads 102 may have a bar shape or a shape similar to a bar shape, extending in the second direction, and the second substrate pads 104 may have a circular shape or a shape similar to the circular shape. However, the present embodiment is not limited thereto and the size, number, arrangement, shape or the like of the first substrate pads 102 and the second substrate pads 104 may be modified in various ways.

Referring to FIG. 1 and FIG. 3, the first semiconductor chip 200 may include a bottom surface 200A, facing a top surface 100B of the substrate 100, the top surface 200B, located on the opposite side of the bottom surface 200A, and side surfaces, connecting the bottom surface 200A and the top surface 200B. The bottom surface 200A of the first semiconductor chip 200 may include two edge regions E1. That is, each of the two edge regions E1 may have a width, corresponding to less than half of the total width of the first semiconductor chip 200 in the second direction, and a central region C1 between both of the edge regions E1.

In the central region C1 of the bottom surface 200A of the first semiconductor chip 200, first chip pads 202 may be disposed to electrically connect the first semiconductor chip 200 to the substrate 100. That is, the first semiconductor chip 200 may be a center-pad type. In the present embodiment, the first chip pads 202 may be disposed in a line in the central region C1 in the first direction, and the row of the first chip pads 202 may be biased to one side, for example, the right side, in the second direction instead of the center of the central region C1. However, the present embodiment is not limited thereto and the number and arrangement of the first chip pads 202 may be modified in various ways. Furthermore, the first chip pads 202 may have a rectangular planar shape; however, the present embodiment is not limited thereto and the planar shape may be modified in various ways.

The first semiconductor chip 200 may be attached to the top surface 100B of the substrate 100 through an adhesive material (not illustrated), and the bottom surface 200A, on which the first chip pads 202 are disposed, may be attached to face the top surface 100B of the substrate 100. That is, the first semiconductor chip 200 may be attached to the substrate 100 in a face-down manner. Furthermore, the first semiconductor chip 200 may be disposed such that the central region C1 and/or the first chip pads 202 are aligned with the opening 106 of the substrate 100. Accordingly, the first chip pads 202 may be exposed through the opening 106 of the substrate 100.

The first semiconductor chip 200 may include a volatile memory, such as a dynamic random access memory (DRAM). However, the present embodiment is not limited thereto and the first semiconductor chip 200 may include various integrated circuit devices, such as other volatile memories such as a static random access memory (SRAM), nonvolatile memories such as a NAND flash, a phase-change random access memory (PRAM), and a magnetoresistive random access memory (MRAM), logic devices, and processors.

Referring to FIG. 1, FIG. 4A, and FIG. 4B, the second semiconductor chip 300 may include a bottom surface 300A facing the top surface 100B of the substrate 100 and/or the top surface 200B of the first semiconductor chip 200, a top surface 300B located on the opposite side of the bottom surface 300A, and side surfaces connecting the bottom surface 300A to the top surface 300B. The bottom surface 300A of the second semiconductor chip 300 may include two edge regions E2. That is, each of the two edge regions E2 may have a width, corresponding to less than half of the total width of the second semiconductor chip 300 in the second direction, and a central region C2 between both of the edge regions E2.

In the central region C2 of the bottom surface 300A of the second semiconductor chip 300, second chip pads 302 may be disposed to electrically connect the second semiconductor chip 300 to the substrate 100. That is, the second semiconductor chip 300 may be a center-pad type. In the present embodiment, the second chip pads 302 may be disposed in a line in the central region C2 in the first direction, and the row of the second chip pads 302 may be biased to one side, for example, the right side, in the second direction instead of the center of the central region C2. However, the present embodiment is not limited thereto and the number and arrangement of the second chip pads 302 may be modified in various ways. Furthermore, the second chip pads 302 may have a rectangular planar shape; however, the present embodiment is not limited thereto and the planar shape may be modified in various ways.

In the present embodiment, the second semiconductor chip 300 may be substantially the same chip as the first semiconductor chip 200. In such a case, the second semiconductor chip 300 may include substantially the same kind of integrated circuit device as the first semiconductor chip 200. Furthermore, the second semiconductor chip 300 may have substantially the same planar area as the first semiconductor chip 200, and the shape, arrangement, and number of the second chip pads 302 may be substantially the same as those of the first chip pads (202 of FIG. 3). However, for convenience of description, the second semiconductor chip 300 and the second chip pads 302 are illustrated as thicker lines than the first semiconductor chip 200 and the first chip pads (202 of FIG. 3).

The second semiconductor chip 300 may be attached to the top surface 200B of the first semiconductor chip 200, through an adhesive material (not illustrated), and the bottom surface 300A, on which the second chip pads 302 are disposed, may be attached to face the top surface 100B of the substrate 100. That is, the second semiconductor chip 300 may be mounted on the substrate 100 in a face-down manner. The second semiconductor chip 300 may be disposed such that a part of the second semiconductor chip 300 overlaps with the first semiconductor chip 200 in the first direction, and the central region C2 and/or the second chip pads 302 are aligned with the opening 106 of the substrate 100. Therefore, some of the second chip pads 302, in a region (see A1 of FIG. 4A and hereinafter, referred to as an overlap region), overlapping the first semiconductor chip 200, are not exposed through the opening 106 because they are covered by the first semiconductor chip 200. On the other hand, the second chip pads 302, in a region (see A2 of FIG. 4A and hereinafter, referred to as a non-overlap region) other than the overlap region A1, may be exposed through the opening 106.

As described above, since the second chip pads 302 of the overlap region A1 among the second chip pads 302 of the second semiconductor chip 300 are covered by the first semiconductor chip 200, it is difficult to connect the second chip pads 302 to the substrate 100 by a wire bonding process. In order to solve such a problem, the second semiconductor chip 300 may further include a redistribution layer 320 that is formed on the bottom surface 300A. The redistribution layer 320 may include redistribution conductive layers 322 and 324 and redistribution insulating layers 326 and 328.

Specifically, on the plane illustrated in FIG. 4A, the redistribution conductive layers 322 and 324 may include redistribution pads 322 and redistribution lines 324. The redistribution pads 322 may be formed in the non-overlap region A2 of the central area C2 of the second semiconductor chip 300. The redistribution lines 324 may extend from the second chip pads 302 of the overlap region A1 to the redistribution pads 322 of the non-overlap region A2. The redistribution pads 322 may be formed to correspond to the second chip pads 302 of the overlap region A1 in a one-to-one manner and may be disposed in a region, where the second chip pads 302 are not disposed, within the non-overlap region A2 of the central area C2. The redistribution pads 322 may be disposed in a line in the first direction. For example, when the row of the second chip pads 302 is biased to one side in the second direction in the central area C2, the row of the redistribution pads 322 may be biased to the other side in the second direction. FIG. 4A illustrates an example in which the row of the second chip pads 302 is disposed to be biased to the right side and the row of the redistribution pads 322 is disposed to be biased to the left side. For convenience of description, the planar shape of the redistribution pads 322 is illustrated as a circle, but the planar shape of the redistribution pads 322 may be modified in various ways like a rectangular shape. In another embodiment, the redistribution pads 322 may also have substantially the same planar shape and size as those of the second chip pads 302. Furthermore, the number and arrangement of the redistribution pads 322 may be modified in various ways. The redistribution lines 324 may have a shape bent in a curve for connection from the second chip pads 302 of the overlap region A1 to the redistribution pads 322 of the non-overlap region A2. The redistribution lines 324 may be formed so as not to cross each other. To this end, among the second chip pads 302 of the overlap region A1 and the redistribution pads 322 of the non-overlap region A2, pads, adjacent to each other, may be connected to each other and pads, far away from each other, may be connected to each other. For example, a redistribution pad 322-1, closest to the overlap region A1 in the first direction, and a second chip pad 302-1 of the overlap region A1, closest to the non-overlap region A2, may be connected to each other by the shortest redistribution line 324-1, and a redistribution pad 322-2, farthest from the overlap region A1 in the first direction, and a second chip pad 302-2 of the overlap region A1, farthest from the non-overlap region A2, may be connected to each other by the longest redistribution line 324-2.

Referring to the section illustrated in FIG. 4B, the redistribution conductive layers 322 and 324 may be electrically isolated from other components, except for portions exposed by the redistribution insulating layers 326 and 328. The first redistribution insulating layer 326, covering the bottom surface of the second semiconductor chip 300, may have an opening that exposes the surface of the second chip pad 302. The redistribution line 324 may extend over the first redistribution insulating layer 326 while electrically connecting to the second chip pad 302 by filling the opening of the first redistribution insulating layer 326. The redistribution line 324 may extend in a line shape having a narrow width, while having an end with a relative large width. The second redistribution insulating layer 328 may have an opening that exposes the end of the redistribution line 324 while covering the redistribution line 324 and the first redistribution insulating layer 326. A part of the end of the redistribution line 324, which is exposed by the opening formed in the second redistribution insulating layer 328, may constitute the redistribution pad 322.

When viewed from below, the semiconductor package, including the substrate 100, the first semiconductor chip 200, and the second semiconductor chip 300, described above, may be substantially the same as FIG. 5 and FIG. 6. Furthermore, when viewed from the side in the first direction, the semiconductor package may be substantially the same as FIG. 7. For convenience of description, although FIG. 5 does not illustrate the first and second substrate pads 102 and 104 and interconnectors 500, and FIG. 6 does not illustrate the redistribution line 324, the semiconductor package of the present embodiment may include all the configurations illustrated in FIG. 5 and FIG. 6. Detailed description of parts substantially the same as those described in FIG. 1 to FIG. 3, FIG. 4A, and FIG. 4B will be omitted.

Referring to FIG. 1, FIG. 5, FIG. 6, and FIG. 7, the substrate 100 may have the opening 106 extending in the first direction. The substrate 100 may include the first substrate pads 102 for connection with the first and second semiconductor chips 200 and 300 and the second substrate pads 104 for connection with an external connection element 400 on the bottom surface 100A thereof.

The external connection element 400 may be connected to the second substrate pads 104 on the bottom surface 100A of the substrate 100. In the present embodiment, a solder ball is used as the external connection element 400. However, the present embodiment is not limited thereto and various types of electrical connectors may be used. The package of the present embodiment may be connected to various external devices, such as module substrates through such an external connection element 400.

On the top surface 100B of the substrate 100, the first and second semiconductor chips 200 and 300 may be stacked and disposed in a step-wise manner in the first direction. That is, the second semiconductor chip 300 may be positioned away from the first semiconductor chip 200 by a predetermined distance in the first direction such that the first semiconductor chip 200 and the second semiconductor chip 300 partially overlap with each other in the first direction. According to the embodiment, when the first semiconductor chip 200 and the second semiconductor chip 300 have substantially the same planar shape, the first semiconductor chip 200 and the second semiconductor chip 300 may be aligned with each other along the second direction.

Since the first chip pads 202 of the first semiconductor chip 200 are disposed in the central area C1 of the bottom surface 200A of the first semiconductor chip 200 and are aligned with the opening 106 of the substrate 100, the first chip pads 202 may be exposed through the opening 106. The second chip pads 302 of the second semiconductor chip 300 may be disposed in the central area C2 of the bottom surface 300A of the second semiconductor chip 300 and may be aligned with the opening 106 of the substrate 100. However, some (see dotted rectangles of FIG. 6) of the second chip pads 302 of the second semiconductor chip 300 may overlap with the first semiconductor chip 200 and thus might not be exposed through the opening 106. The second chip pads 302 of the second semiconductor chip 300, which are located in the overlap region A1 with the first semiconductor chip 200, may be connected to the redistribution pads 322, which are located in the central area C2 of the bottom surface 300A of the second semiconductor chip 300 and the non-overlap region A2, through the redistribution lines 324. The redistribution pads 322 may be exposed through the opening 106.

The first chip pads 202 and the first substrate pads 102 may be electrically connected to each other through the interconnectors 500 extending through the opening 106. In the present embodiment, the interconnectors 500 may be bonding wires. In such a case, the bonding wire may have ends coupled to the first substrate pad 102 and the first chip pad 202, respectively. The bonding wire may include a metal such as gold, silver, copper, and platinum or an alloy including the same, which may be welded to the first substrate pad 102 and the chip pad 202 by ultrasonic energy and/or heat. However, the present embodiment is not limited thereto and various types of electrical interconnectors such as leads may be used.

When the row of the first chip pads 202 exposed through the opening 106 is biased to one side in the second direction, for example, the right side, the first chip pads 202 may be electrically connected to the first substrate pads 102 that are relatively close to the first chip pads 202 among the first substrate pads 102 on both sides of the opening 106, that is, the first substrate pads 102 on the right side of the opening 106. Hereinafter, for convenience of description, the first substrate pads 102 on the right side of the opening 106 are referred to as right first substrate pads 102A and the first substrate pads 102 on the left side of the opening 106 are referred to as left first substrate pads 102B.

Furthermore, the second chip pads 302 and the redistribution pads 322 may be electrically connected to the first substrate pads 102 through the interconnectors 500, respectively. The interconnectors 500 connecting the second chip pads 302 or the redistribution pads 322 and the first substrate pads 102 may extend to pass through the opening 106. In order to suppress failure due to interference or an electrical short circuit in the interconnectors 500 electrically connecting the second chip pads 302 or the redistribution pads 322 and the first substrate pads 102 in a package fabrication process, the second chip pads 302 and the redistribution pads 322 may be electrically connected to the first substrate pads 102 that are relatively close to the second chip pads 302 and the redistribution pads 322 among the first substrate pads 102 on both sides of the opening 106. When the row of the second chip pads 302 is biased to one side in the second direction, for example, the right side, the second chip pads 302 may be electrically connected to the right first substrate pads 102A that are relatively close to the second chip pads 302 among the first substrate pads 102 on both sides of the opening 106. On the other hand, when the row of the redistribution pads 322 is biased to the other side in the second direction, for example, the left side, the redistribution pads 322 may be electrically connected to the left first substrate pads 102B.

A first adhesive layer 610 may be interposed between the first semiconductor chip 200 and the substrate 100 to attach the bottom surface 200A of the first semiconductor chip 200 to the top surface 100B of the substrate 100. The first adhesive layer 610 may be formed to cover the edge region (see E1 of FIG. 3) while exposing the central area (see C1 of FIG. 3) of the bottom surface 200A of the first semiconductor chip 200. Furthermore, a second adhesive layer 620 may be interposed between the second semiconductor chip 300 and the first semiconductor chip 200 to attach the bottom surface 300A of the second semiconductor chip 300 to the top surface 200B of the first semiconductor chip 200. The second adhesive layer 620 may be formed to cover the edge region (see E2 of FIG. 4A) while exposing the central area (see C2 of FIG. 4A) of the bottom surface 300A of the second semiconductor chip 300, and formed between the redistribution layer 320 and the first semiconductor chip 200 instead of directly contacting with the bottom surface 300A of the second semiconductor chip 300.

Since the redistribution layer 320 is present on the bottom surface 300A of the second semiconductor chip 300, the second chip pads 302 may be exposed through the openings formed in the redistribution insulating layers 326 and 328.

An encapsulant 700 may be formed to cover the substrate 100, the first semiconductor chip 200, and the second semiconductor chip 300. Particularly, the encapsulant 700 may be formed to surround the interconnectors 500 while filling a space between the first semiconductor chip 200 and the second semiconductor chip 300 and the opening 106 of the substrate 100. The encapsulant 700 may be formed of a material such as an epoxy molding compound.

Based on the semiconductor package described above, it is possible to acquire the following advantages.

First, since the semiconductor package has a region where the two semiconductor chips 200 and 300 overlap with each other in the first direction, it is possible to reduce an area of the semiconductor package compared to a structure in which the two semiconductor chips 200 and 300 are disposed side by side.

Furthermore, since the redistribution layer 320 is formed only in the second semiconductor chip 300, it is possible to reduce the process cost required for forming the redistribution layer, compared to a structure in which the redistribution layer is formed in all of the semiconductor chips.

Although the aforementioned embodiment has described the case where the chip pads are arranged in a line and the redistribution pads are arranged in a line at a position different from that of the row of the chip pads, the chip pads may be arranged in two or more rows. In such a case, it may be necessary to adjust the position of the redistribution pads. This will be described with reference to FIG. 8 and FIG. 9 below.

Figure 8:
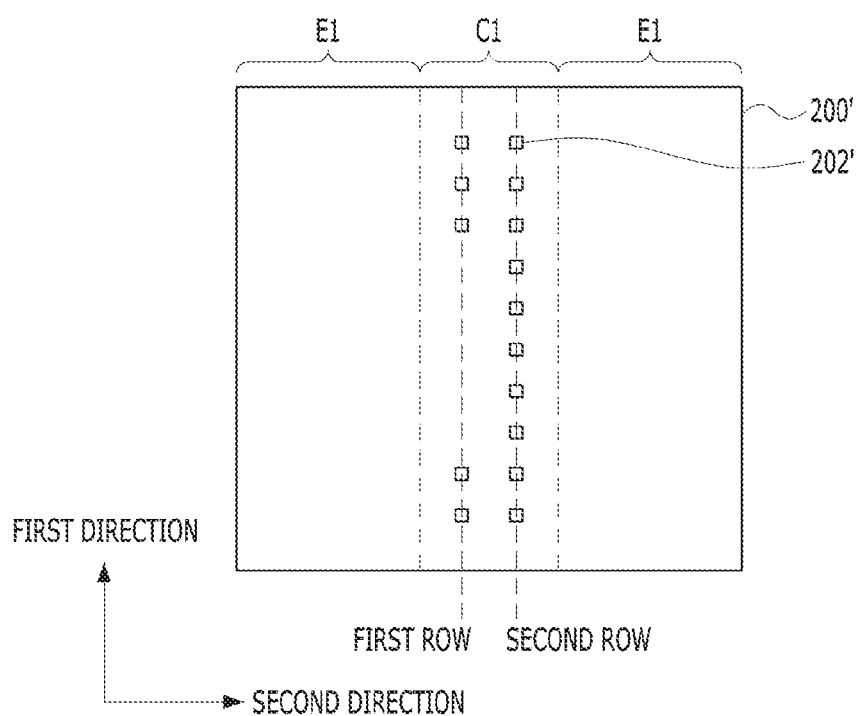
FIG. 8 is a plan view illustrating a bottom surface of a first semiconductor chip in accordance with another embodiment.
Figure 9:
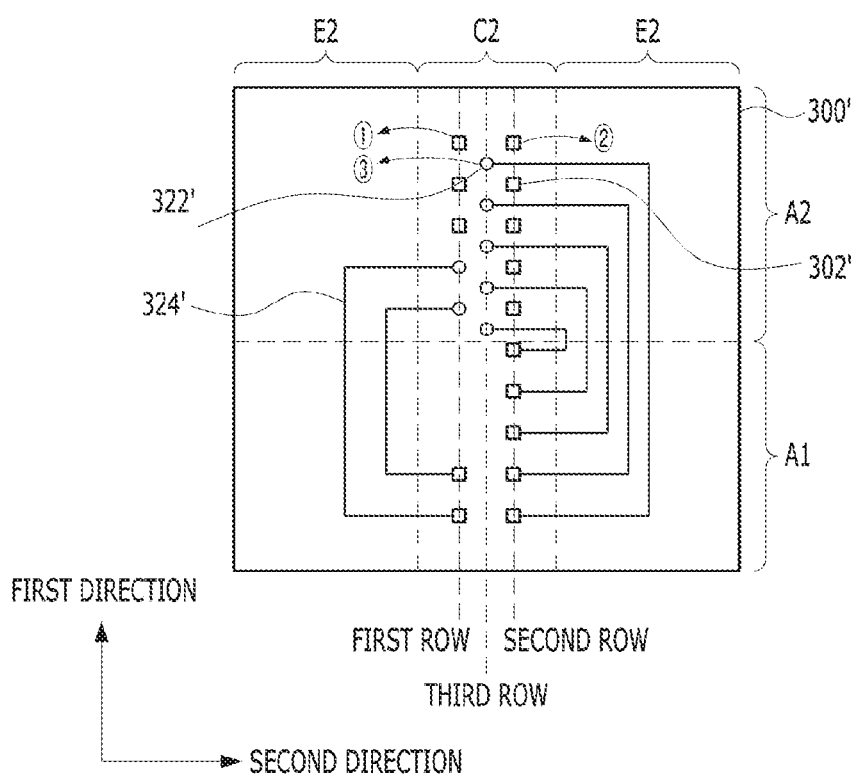
FIG. 9 is a plan view illustrating a bottom surface of a second semiconductor chip in accordance with another embodiment.

FIG. 8 is a plan view illustrating a bottom surface of a first semiconductor chip in accordance with another embodiment, and FIG. 9 is a plan view illustrating a bottom surface of a second semiconductor chip in accordance with another embodiment. The first semiconductor chip of FIG. 8 and the second semiconductor chip of FIG. 9 may be disposed on the substrate 100 in substantially the same manner as described in the aforementioned embodiment. Hereinafter, differences from the aforementioned embodiment will be mainly described.

Referring to FIG. 8, a bottom surface of a first semiconductor chip 200' of the present embodiment may have a central region C1 and edge regions E1, and first chip pads 202' may be exposed in the central region C1.

The first chip pads 202' may be arranged in two rows based on the second direction. In the second direction, a row of the first chip pads 202' which is arranged relatively to the left, is hereinafter referred to as a first row, and a row of the first chip pads 202' which is arranged relatively to the right, is hereinafter referred to as a second row.

In the present embodiment, the number of first chip pads 202' in the first row may be less than that of first chip pads 202' in the second row, so that an empty space may exist in the first row compared to the second row. However, the present embodiment is not limited thereto and the number of first chip pads 202' in the first row and the number of first chip pads 202' in the second row may be modified in various ways.

Referring to FIG. 9, the bottom surface of the second semiconductor chip 300' of the present embodiment may have a central region C2 and edge regions E2, and second chip pads 302' may be exposed in the central region C2.

In the present embodiment, the arrangement of the second chip pads 302' may be substantially the same as that of the first chip pads 202'. That is, the second chip pads 302' may be arranged in the first and second rows in the second direction, and the number of second chip pads 302' in the first row may be less than that of second chip pads 302' in the second row, so that an empty space may exist in the first row compared to the second row. However, the present embodiment is not limited thereto and the number of second chip pads 302' in the first row and the number of second chip pads 302' in the second row may be modified in various ways.

Since the second chip pads 302' of the overlap region A1 among the second chip pads 302' are to be covered by the first semiconductor chip 200', it may be necessary to form redistribution pads 322' and redistribution lines 324' that are connected to the second chip pads 302'.

First, unlike the present embodiment, all the redistribution pads 322' may be formed in the first row and/or the second row. In other words, the first row and/or the second row may have a space where the redistribution pads 322' to be connected to all of the second chip pads 302' of the overlap region A1 may be formed. In such a case, since the redistribution pads 322' and/or the second chip pads 302' of the first row may be connected to the left substrate pads of the substrate opening, and the redistribution pads 322' and/or the second chip pads 302' of the second row may be connected to the right substrate pads of the substrate opening, there is an advantage in that a process such as wire bonding is facilitated.

On the other hand, as in the present embodiment, only some of the redistribution pads 322' may also be formed in the first row and/or the second row. For example, as illustrated in FIG. 9, there may exist an empty space where the formation of seven redistribution pads 322' which are connected to seven second chip pads 302' of the overlap region A1, respectively, is required. However, only two redistribution pads 322' could be disposed in the first row of the non-overlap region A2. In such a case, the remaining redistribution pads 322' may be disposed in a third row at a position different from the first row and the second row. For example, as illustrated in FIG. 9, two redistribution pads 322' may be disposed in the first row and five redistribution pads 322' may be disposed in the third row, located between the first row and the second row.

As described above, when the redistribution pads 322' are located in the third row different from the first row and the second row in the first direction, the redistribution pads 322' of the third row may be disposed to be offset from the second chip pads 302' of the second row while being disposed to be offset from the second chip pads 302' and the redistribution pads 322' of the first row. This is to provide a space for wires to be formed during subsequent wire bonding, and thus, preventing a short circuit between the wires. For example, when the second chip pads 302' and the redistribution pads 322' of the first row are wire-bonded to the substrate pads on the left side of the substrate opening (see arrow ①) and the second chip pads 302' of the second row are wire-bonded to the substrate pads on the right side of the substrate opening (see arrow ②), the redistribution pads 322' of the third row may be wire-bonded to the substrate pads on the left side of the substrate opening (see arrow ③) or the substrate pads on the right side of the substrate opening. In such a case, since a wire connected to the redistribution pad 322' of the third row extends to a space between the second chip pads 302' adjacent in the first direction, it is possible to prevent a short circuit with a wire connected to the second chip pads 302'.

The redistribution lines 324' may have a shape bent in a curve for connection from the second chip pads 302' of the overlap region A1 to the redistribution pads 322' of the non-overlap region A2. The redistribution lines 324' may be formed so as not to cross each other. To this end, the redistribution lines 324' may make a detour to another side in the second direction so as to be connected to the redistribution pads 322' of different rows. For example, the redistribution lines 324' may extend relatively to the left from the redistribution pads 322' of the first row, be bent in the first direction, and extend to the second chip pads 302' of the first row in the overlap region A1. Furthermore, the redistribution lines 324' may extend relatively to the right from the redistribution pads 322' of the third row, be bent in the first direction, and extend to the second chip pads 302' of the second row in the overlap region A1.

Based on the present embodiment, even though the number, arrangement or the like of the chip pads 202' and 302' and the redistribution pads 322' are modified, it is possible to acquire the advantages of the aforementioned embodiment.

Figure 10:
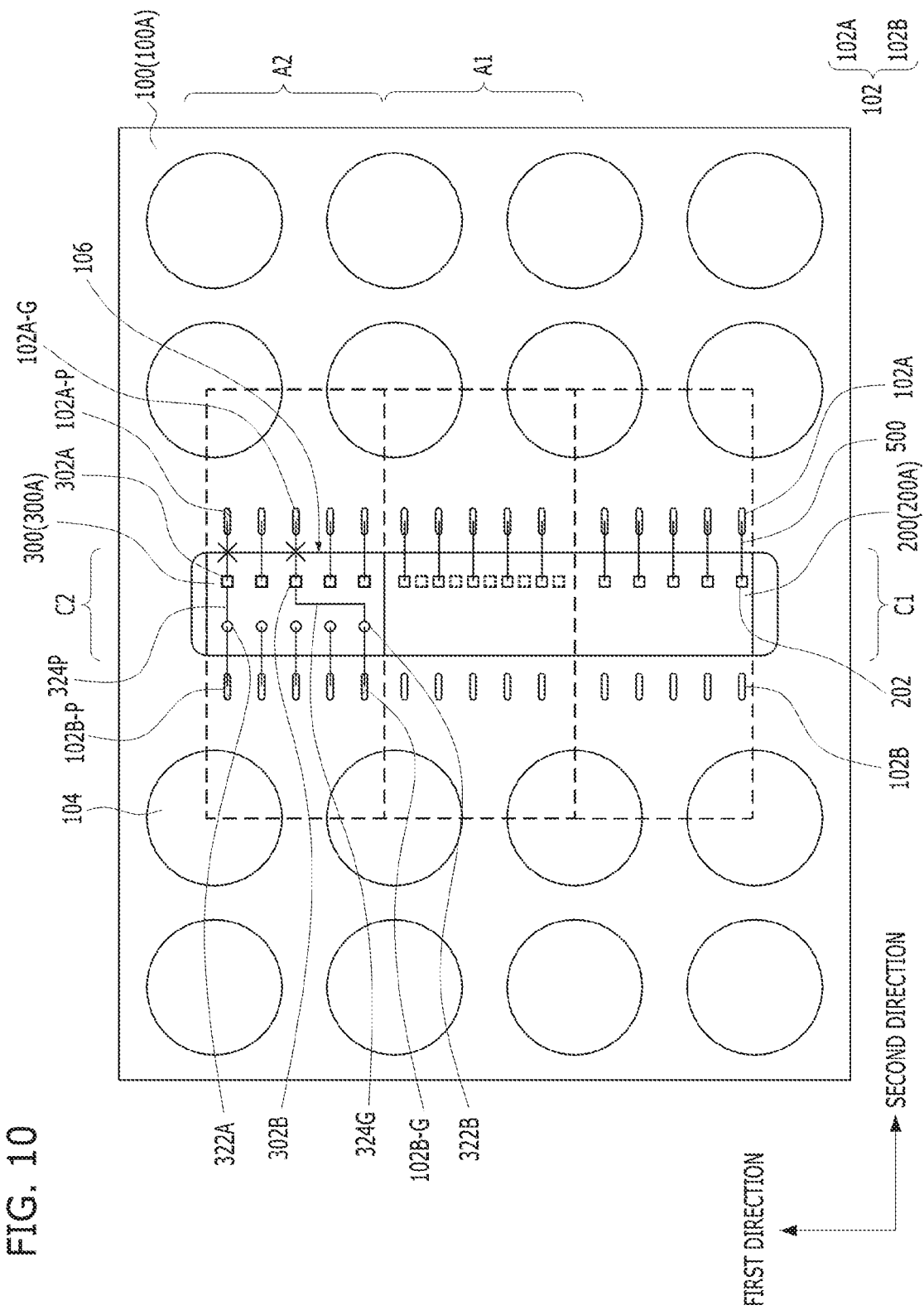
FIG. 10 is a plan view illustrating a semiconductor package in accordance with another embodiment.

FIG. 10 is a plan view illustrating a semiconductor package in accordance with further another embodiment, and is a view illustrating the overlap between the first semiconductor chip and the second semiconductor chip and connection with the substrate based on the overlap from below similarly to FIG. 6, and does not illustrate the redistribution lines (324 of FIG. 5). Hereinafter, differences from the aforementioned embodiment will be mainly described.

Referring to FIG. 10, the first substrate pads 102 may be classified into right first substrate pads 102A and left first substrate pads 102B based on the opening 106 as described above. The first substrate pad 102 may include an input/output pad to which various input/output signals required for an operation of the semiconductor chip are applied, a ground pad connected to the ground, a power pad connected to a power source, or the like. For convenience of description, among the right first substrate pads 102A, the power pad is denoted by reference numeral 102A-P and the ground pad is denoted by reference numeral 102A-G. Also, among the left first substrate pads 102B, the power pad is denoted by reference numeral 102B-P and the ground pad is denoted by reference numeral 102B-G. In the present embodiment, the two power pads 102A-P and 102B-P and the two ground pads 102A-G and 102B-G are marked at arbitrary positions, but the number or arrangement of power pads and ground pads may be modified in various ways.

A second chip pad 302A connected to the right power pad 102A-P and a redistribution pad 322A connected to the left power pad 102B-P may be connected to each other to share a power supply path. To this end, an additional redistribution line 324P may be formed between the redistribution pad 322A and the second chip pad 302A.

Furthermore, a second chip pad 302B connected to the right ground pad 102A-G and a redistribution pad 322B connected to the left ground pad 102B-G may be connected to each other to share a ground path. To this end, an additional redistribution line 324G may be formed between the redistribution pad 322B and the second chip pad 302B.

Based on the present embodiment, the following advantages can be acquired in addition to the advantages of the aforementioned embodiment.

First, any one of a bonding wire between the redistribution pad 322A and the left power pad 102B-P and a bonding wire between the second chip pad 302A and the right power pad 102A-P may be omitted (see mark X of FIG. 10). Alternatively, any one of a bonding wire between the redistribution pad 322B and the left ground pad 102B-G and a bonding wire between the second chip pad 302B and the right ground pad 102A-G may be omitted (see mark X of FIG. 10). This is because the redistribution pad 322A and the second chip pad 302A may be tied to share the power supply path or the redistribution pad 322B and the second chip pad 302B may be tied to share the ground path. Accordingly, process simplification and process cost reduction by the omission of the bonding wires may be possible.

Meanwhile, when the redistribution pads 322A and 322B and the second chip pads 302A and 302B are tied together, particularly, when they are tied at a close distance as in the embodiment of FIG. 10, power distribution network (PDN) characteristics can be improved. That is, it is possible to reduce the inductance and resistance of the power supply path or the ground path. Specific operation principle will be described with reference to FIG. 11.

Figure 11:
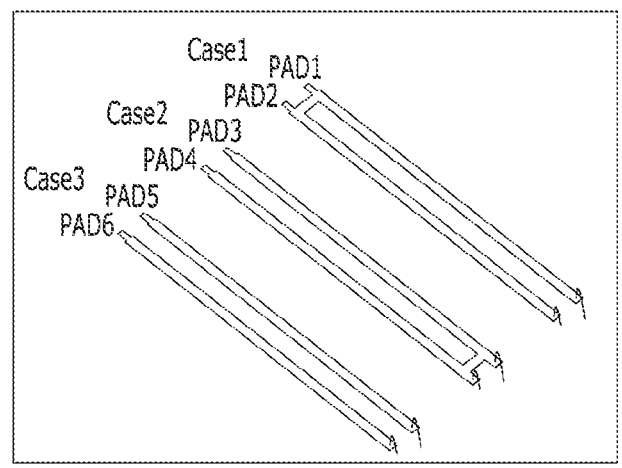
FIG. 11 is a view illustrating inductance and resistance characteristics when some of two interconnections share a path in contact with each other.
Figure 11:
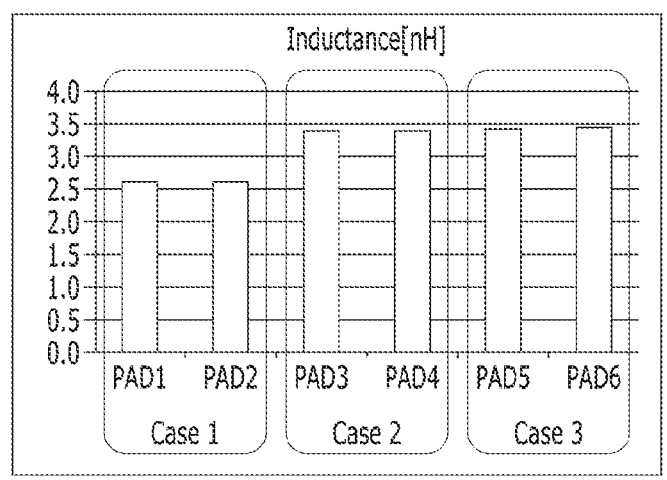
Figure 11:
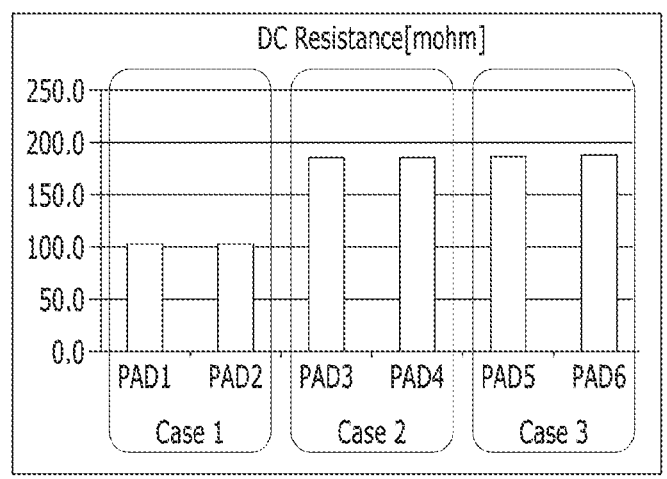

FIG. 11 is a view illustrating inductance and resistance characteristics when some of two interconnections share a path in contact with each other.

Referring to FIG. 11, when transfer paths of two signals are tied together at a position close to a starting point, that is, a pad (see Case 1), it can be understood that inductance and resistance are the lowest compared to a case where the transfer paths are tied together at a position far from the starting point (see Case 2) or a case where the transfer paths are not tied (see Case 3).

Based on FIG. 11, since the redistribution pads 322A and 322B and the second chip pads 302A and 302B are tied together at close positions by the additional redistribution lines 324P and 324G, the inductance and resistance of the power supply path or the ground path can be improved compared to a case where they are not tied or a case where they are tied together at a at a position far from the starting point by, for example, an interconnection or the like in the substrate 100. That is, the PDN characteristics of Case 1 is better than the PDN characteristics of Case 2 or Case 3.

Figure 12:
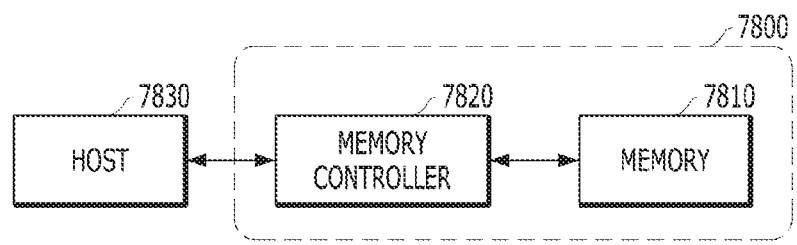
FIG. 12 shows a block diagram illustrating an electronic system employing a memory card including a semiconductor package, according to an embodiment.

FIG. 12 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 13:
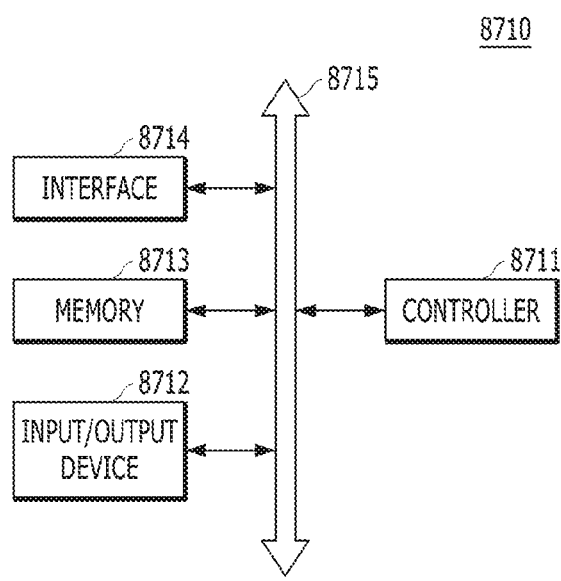
FIG. 13 shows a block diagram illustrating another electronic system including a semiconductor package, according to an embodiment

FIG. 13 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the invention as defined in the following claims.

What is claimed is:

1. A semiconductor package comprising:
   a substrate including an opening;
   a first semiconductor chip, disposed on the substrate, including a plurality of first chip pads exposed through the opening;
   a second semiconductor chip, disposed on the first semiconductor chip to partially overlap with the first semiconductor chip, including a plurality of second chip pads, aligned with the opening; and
   a redistribution layer formed on a surface on which the second chip pads of the second semiconductor chip are disposed,
   wherein one or more of the second chip pads overlap with the first semiconductor chip and are covered by the first semiconductor chip, with remaining pads of the second chip pads being exposed through the opening, and
   wherein the redistribution layer includes redistribution pads, exposed through the opening, and includes redistribution lines, configured to connect the one or more of the second chip pads to the redistribution pads.

2. The semiconductor package of claim 1, wherein a width of the opening in a first direction is larger than a width of the opening in a second direction substantially perpendicular to the first direction, and
   the second semiconductor chip is disposed to partially overlap with the first semiconductor chip in the first direction.

3. The semiconductor package of claim 1, wherein the substrate has a first surface facing the first semiconductor chip, and a second surface, located opposite to the first surface, and includes first substrate pads, located on the second surface of the substrate.

4. The semiconductor package of claim 3, further comprising interconnectors configured to connect the first chip pads, the remaining pads of the second chip pads, and the redistribution pads to the first substrate pads through the opening.

5. The semiconductor package of claim 4, wherein the first substrate pads include one-side first substrate pads, disposed on one side of the opening, and other-side first substrate pads, disposed on the other side of the opening,
   wherein the interconnectors, connected to the first chip pads, and the remaining pads of the second chip pads, are connected to the one-side first substrate pads, and
   wherein the interconnectors, connected to the redistribution pads, are connected to the other-side first substrate pads.

6. The semiconductor package of claim 1, wherein the second semiconductor chip is disposed to partially overlap with the first semiconductor chip in the first direction,
   the second chip pads are arranged in a line in the first direction, and
   the redistribution pads are arranged in a line in the first direction on one side of a row of the second chip pads.

7. The semiconductor package of claim 6, wherein the substrate has a first surface facing the first semiconductor chip and a second surface located opposite to the first surface and includes one-side first substrate pads located on the second surface of the substrate and disposed on one side of the opening and other-side first substrate pads located on the second surface of the substrate and disposed on the other side of the opening, and
   the semiconductor package further comprises:
   interconnectors configured to connect the redistribution pads to the one-side first substrate pads and connect the remaining pads of the second chip pads to the other-side first substrate pads.

8. The semiconductor package of claim 1, wherein the second semiconductor chip is disposed to partially overlap with the first semiconductor chip in the first direction,
   the second chip pads include a first row arranged in a line in the first direction and a second row arranged in a line in the first direction on one side of the first row and at least one of the first row and the second row has a space where the second chip pads are not disposed, and
   the redistribution pads are disposed in the space.

9. The semiconductor package of claim 8, wherein the substrate has a first surface facing the first semiconductor chip and a second surface located opposite to the first surface and includes one-side first substrate pads located on the second surface of the substrate and disposed on one side of the opening and other-side first substrate pads located on the second surface of the substrate and disposed on the other side of the opening, and
   the semiconductor package further comprises:
   interconnectors configured to connect the remaining pads of the second chip pads of the first row or the redistribution pads of the first row to the one-side first substrate pads and connect the remaining pads of the second chip pads of the second row or the redistribution pads of the second row to the other-side first substrate pads.

10. The semiconductor package of claim 1, wherein the second semiconductor chip is disposed to partially overlap with the first semiconductor chip in the first direction,
the second chip pads include a first row arranged in a line in the first direction and a second row arranged in a line in the first direction on one side of the first row, and
the redistribution pads are arranged in a third row between the first row and the second row in the second direction.

11. The semiconductor package of claim 10, wherein the redistribution pads are alternately arranged with the second chip pads in the first direction.

12. The semiconductor package of claim 1, wherein the substrate has a first surface, facing the first semiconductor chip, and a second surface, opposite to the first surface, and includes a power pad located on the second surface of the substrate, and
wherein the redistribution layer further includes an additional redistribution line that connects the second chip pad and the redistribution pad, which are required to be connected to the power pad.

13. The semiconductor package of claim 12, the semiconductor package further comprising an interconnector configured to connect one of the second chip pad and the redistribution pad, which are required to be connected to the power pad, to the power pad.

14. The semiconductor package of claim 1, wherein the substrate has a first surface, facing the first semiconductor chip, and a second surface, opposite to the first surface, and includes a ground pad, located on the second surface of the substrate, and
wherein the redistribution layer further includes an additional redistribution line that connects the second chip pad and the redistribution pad, which are required to be connected to the ground pad.

15. The semiconductor package of claim 14, the semiconductor package further comprising an interconnector configured to connect one of the second chip pad and the redistribution pad, which are required to be connected to the ground pad, to the ground pad.

16. The semiconductor package of claim 1, wherein the first chip pads are located in a central region of the first semiconductor chip, and
the second chip pads are located in a central region of the second semiconductor chip.

17. The semiconductor package of claim 1, wherein an arrangement of the first chip pads is substantially equal to an arrangement of the second chip pads.

18. The semiconductor package of claim 2, wherein both side surfaces of the first semiconductor chip are aligned with both side surfaces of the second semiconductor chip in the second direction.

19. The semiconductor package of claim 3, wherein the substrate further comprises:
second substrate pads located on the second surface of the substrate and connectable to external connection elements.

20. The semiconductor package of claim 1, further comprising:
a first adhesive layer located between the first semiconductor chip and the substrate; and
a second adhesive layer located between the redistribution layer and the first semiconductor chip.

21. The semiconductor package of claim 1, further comprising:
an encapsulant configured to fill the opening while covering the substrate, the first semiconductor chip, and the second semiconductor chip.

* * * * *